United States Patent
Shafiee Ardestani et al.

(10) Patent No.: US 10,055,383 B1
(45) Date of Patent: Aug. 21, 2018

(54) MATRIX CIRCUITS

(71) Applicant: Hewlett Packard Enterprise Development LP, Houston, TX (US)

(72) Inventors: Ali Shafiee Ardestani, Palo Alto, CA (US); Naveen Muralimanohar, Santa Clara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/581,110

(22) Filed: Apr. 28, 2017

(51) Int. Cl.
   *G06F 7/32* (2006.01)
   *G06F 17/16* (2006.01)
   *G11C 11/24* (2006.01)
   *G11C 11/4096* (2006.01)
   *G11C 13/00* (2006.01)

(52) U.S. Cl.
   CPC ............ *G06F 17/16* (2013.01); *G11C 11/24* (2013.01); *G11C 11/4096* (2013.01); *G11C 13/004* (2013.01); *G11C 13/0069* (2013.01)

(58) Field of Classification Search
   CPC ..................................................... G06F 17/16
   USPC ................................................. 708/520, 607
   See application file for complete search history.

(56) References Cited

U.S. PATENT DOCUMENTS

| | | | | |
|---|---|---|---|---|
| 5,032,865 A | * | 7/1991 | Schlunt | G06F 7/5443 |
| | | | | 708/603 |
| 5,325,215 A | * | 6/1994 | Shibata | G06F 17/147 |
| | | | | 358/1.9 |
| 8,352,847 B2 | | 1/2013 | Gunnam | |
| 9,489,618 B2 | | 11/2016 | Roy et al. | |
| 9,798,519 B2 | * | 10/2017 | Elmer | G06F 7/483 |
| 2014/0379774 A1 | * | 12/2014 | Gupta | G06F 17/10 |
| | | | | 708/523 |
| 2016/0062692 A1 | | 3/2016 | Finkbeiner et al. | |
| 2016/0266873 A1 | | 9/2016 | Tiwari et al. | |

FOREIGN PATENT DOCUMENTS

WO   WO-2009037684   3/2009

\* cited by examiner

*Primary Examiner* — Tan V. Mai
(74) *Attorney, Agent, or Firm* — Hewlett Packard Enterprise Patent Department

(57) ABSTRACT

A circuit is provided. In an example, the circuit includes a memory array that includes a plurality of memory cells to store a matrix and a plurality of data lines coupled to the plurality of memory cells to provide a first set of values of the matrix. The circuit includes a multiplier coupled to the plurality of data lines to multiply the first set of values by a second set of values to produce a third set of values. A summing unit is included that is coupled to the multiplier to sum the third set of values to produce a sum. The circuit includes a shifting unit coupled to the summing unit to shift the sum and to add the shifted sum to a running total.

20 Claims, 10 Drawing Sheets

MATRIX CIRCUITS

BACKGROUND

Matrices are arrays of elements of any suitable size, and these elements may represent data, relationships between data values, transformations to be applied to data, and more. Owing to their flexibility and utility, matrices are used in a wide range of real-world applications. In computing examples, matrices are used to store and manipulate sensor data for controlling automated manufacturing, scientific data for research and modeling, demographic data, other statistical data, and other data types. Matrices are also used extensively in computer graphics. For example, a bitmap is a specific type of matrix in which each entry is a pixel value. As a further example, a digital filter for image processing may be represented as a matrix in which each entry is a transformation to be applied to a portion of an image or frame. A wide body of algebraic operations have been developed to manipulate and analyze matrices and their contents, and because they are utilized with such frequency, computing systems may include dedicated hardware for handling matrices and performing these operations.

BRIEF DESCRIPTION OF THE DRAWINGS

Certain examples are described in the following detailed description with reference to the drawings, of which.

Throughout the drawings, identical reference numbers may designate similar, but not necessarily identical elements.

DETAILED DESCRIPTION OF SPECIFIC EXAMPLES

Figure 1A:
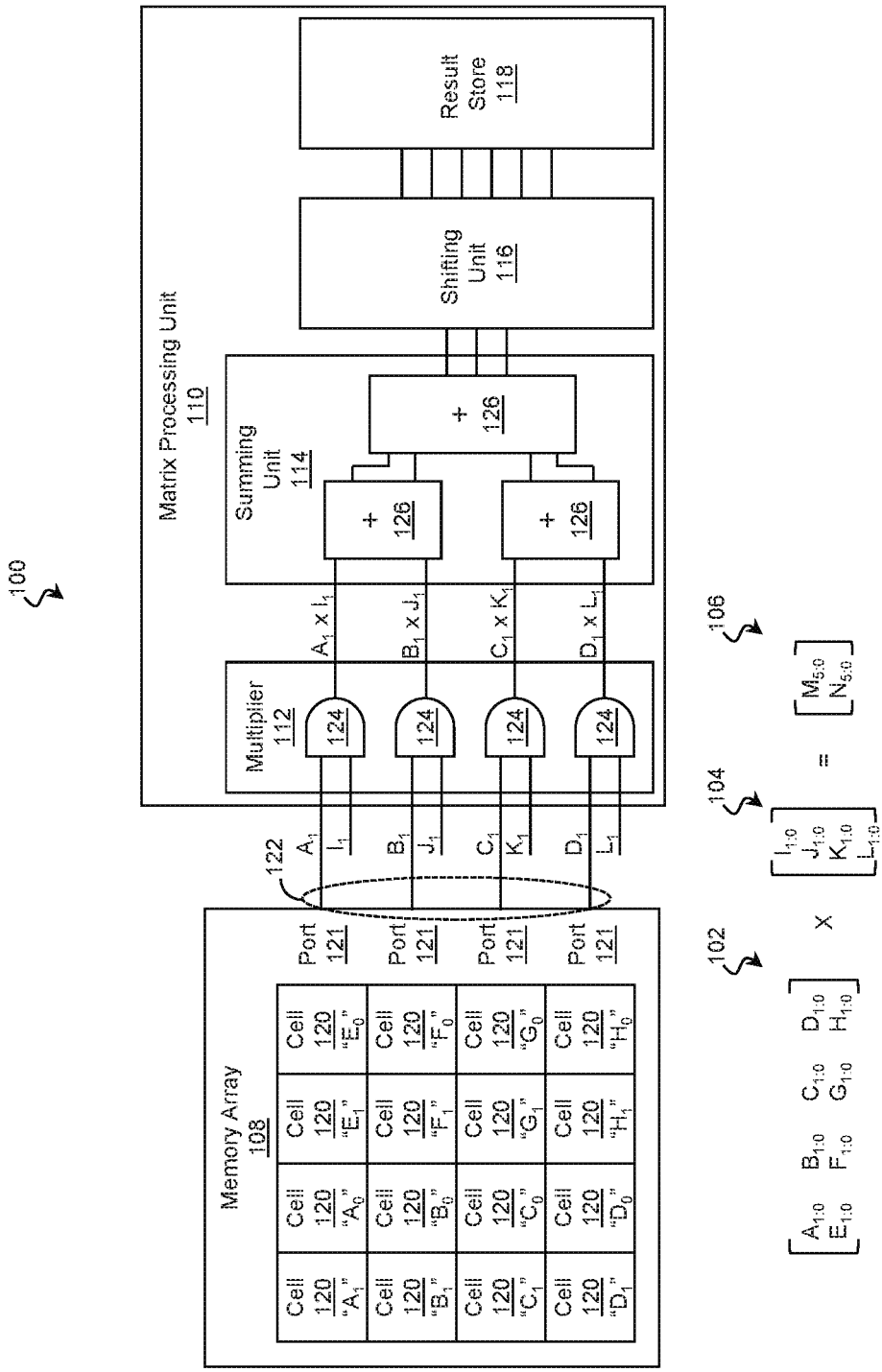
FIGS. 1A-1D are block diagrams of a circuit at various points in time according to some examples of the present disclosure.
Figure 1B:
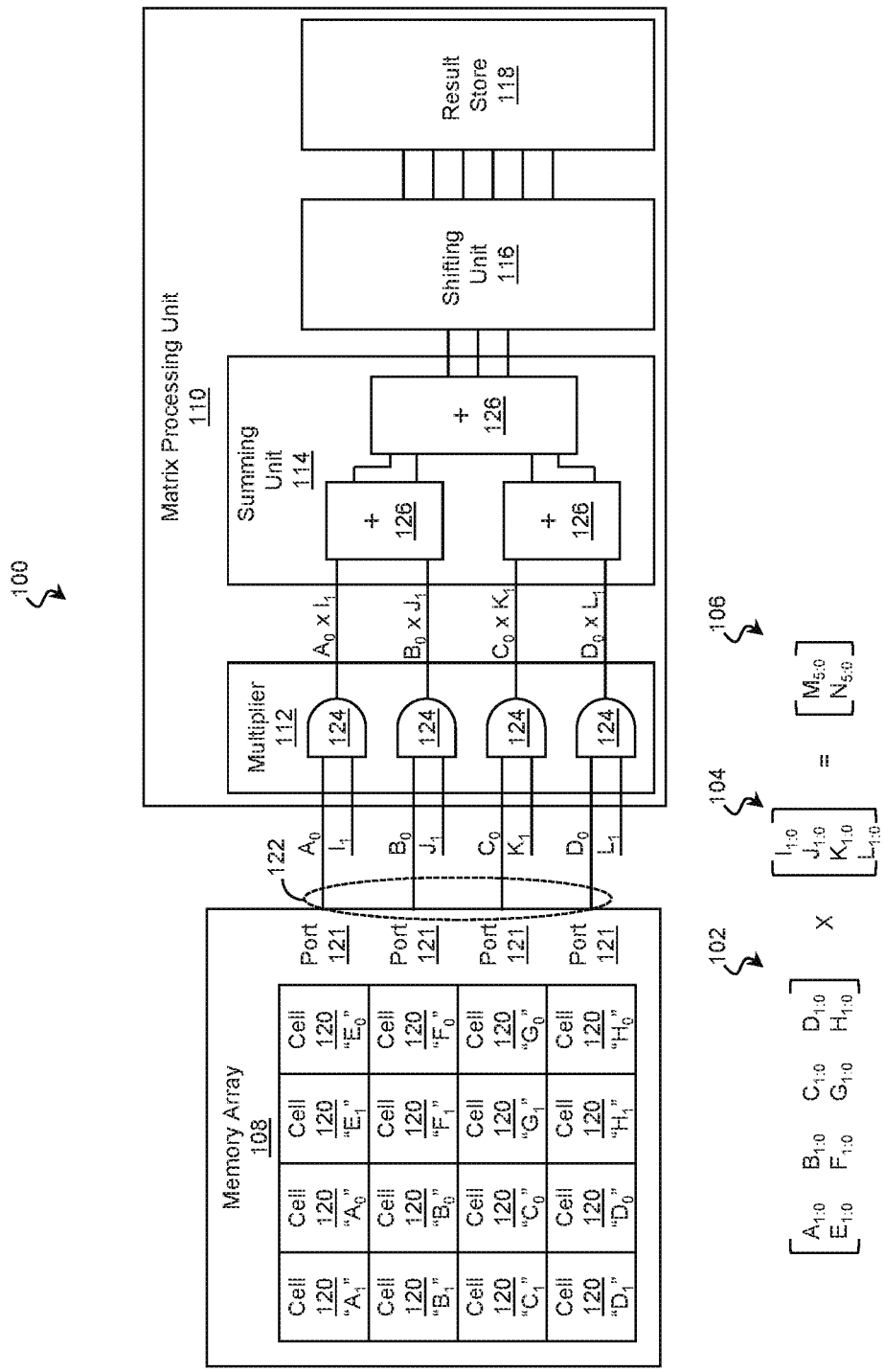

Many computing processors operate on matrices and matrix data, and for this purpose, a processor may include dedicated circuitry for operating on matrices. In some examples, a matrix processor includes a memory array to store a matrix of multi-bit elements and circuitry to multiply the matrix by a vector. To perform operations on a row of the matrix, the memory array may be configured to read a subset of the bits that make up a row's elements, where the values in the subset have a common place value (e.g., $2^0$, $2^1$, $2^2$, etc.). In other words, a first subset may include the least significant bit of each element in the row, a second subset may include the next least significant bit of each element in the row, and so on. Each subset may be provided to a multiplier that multiplies the subsets values by a corresponding value from a subset of a vector. In some examples, the resultant products of this multiplication are summed by a summing unit to produce a dot product of the matrix subset and the vector subset. The sum or dot product is provided to a shifting unit where it is shifted according to the place value of the matrix subset and/or the place value of the vector subset and added to a running total. The matrix processor may repeat the process for each subset of each row of the matrix and/or each subset of the vector such that the running totals represent the matrix-vector product. In some such examples, the sets of vector values are part of a second matrix, and the process is repeated to multiply the first matrix by the second matrix.

The present disclosure provides substantial real-world improvements to the operation and efficiency of a matrix processor. For instance, in some examples, the memory array is structured to store matrices of variable sizes and bit-lengths. This provides additional flexibility without changing the underlying structure of the matrix processor. In some examples, the memory array is structured to support multiple reads between refreshes of the array's memory cells. This may reduce the overhead of maintaining data in the memory array. In some examples, the matrix processor is structured to read and process the matrix a column at a time to parallelize a significant portion of the processing. In some examples, the matrix processor is structured to read multiple columns at a time to further parallelize the matrix operations. Of course, these are merely some of the improvements that the examples described herein may provide.

These examples and others are described with reference to the following figures. Unless noted otherwise, the figures and their accompanying description are non-limiting, and no element is characteristic of any particular example. In that regard, features from one example may be freely incorporated into other examples without departing from the spirit and scope of the disclosure.

FIGS. 1A-1D are block diagrams of a circuit 100 at various points in time according to some examples of the present disclosure. The figures illustrate an example matrix operation performed by the circuit 100 that includes multiplying a matrix 102 by a vector 104 to produce a result vector 106, and the figures include graphical representations of the matrix 102, vector 104, and result vector 106 for clarity of explanation. In the example, the matrix 102 includes elements A-H, each of which has two bits indicated by subscripts, although suitable matrices may be of any size and have any bit-length. The example vector 104 includes elements I-L, each of which has two bits indicated by subscripts and may also be of any size and bit-length. The result vector 106 includes elements M-N, each of which has six bits as determined by the matrix 102 and the vector 104. Of course, in other examples, the matrix 102, the vector 104, and the result vector 106 may be of any suitable size.

The circuit 100 that performs the operation includes a memory array 108 communicatively coupled to a matrix processing unit 110 that includes hardware, software, and/or combinations thereof to perform matrix operations and to perform other processing tasks. In some examples, the matrix processing unit 110 includes a multiplier 112, a summing unit 114, a shifting unit 116, and a result store 118, each of which is described in more detail below.

Referring first to the memory array 108, the array 108 includes a plurality of memory cells 120 to store a matrix. Each memory cell 120 may include any suitable programmable element, and in various examples, the memory cells 120 include Dynamic Random Access Memory (DRAM) elements, Static RAM (SRAM) elements, memristive elements, non-volatile memory elements, flash and/or other solid-state memory elements, magnetic memory elements, etc. The memory array 108 may include any number of memory cells 120 arranged to store a matrix of any size, and the number of memory cells 120 may exceed the size and number of bits of the matrix. For clarity, the matrix values are illustrated within their respective memory cell 120. As can be seen, the matrix elements may be allocated to the memory cells 120 such that when a column of memory cells 120 are read, the values in the column correspond to a row of the matrix (e.g., matrix row A-D) and have the same place value (e.g., $2^1$).

The memory array 108 includes a set of ports 121 to provide the matrix elements on a set of data lines 122 when the memory cells 120 are read. In some examples, the memory array 108 is structured so that when a column of memory cells 120 are read, the corresponding values on the data lines 122 correspond to a row of the matrix and share a common place value. For example, referring to FIG. 1A, a first set of values containing elements $A_1$, $B_1$, $C_1$, and $D_1$ are present on the data lines 122 during a first read.

The data lines 122 are coupled to the multiplier 112. The multiplier 112 includes any combination of hard-coded logic (e.g., CMOS), programmable logic, and/or software to receive the sets of matrix values from the data lines 122 and multiply the sets of matrix values by sets of vector values. In various examples, the vector 104 is stored in the same memory array 108 as the matrix 102, stored in another memory array 108, stored in another suitable programmable structure, and/or is hardcoded for providing to the multiplier 112.

The multiplier 112 performs an element-by-element multiplication of the matrix sets received from the data lines 122 by the vector sets. In some examples, the multiplier 112 includes a plurality of AND devices 124 to multiply each value in a given matrix set by a corresponding value in a given vector set. In this way, the multiplier 112 produces a third set of values. In the example of FIG. 1A, the multiplier 112 multiplies the first set of values containing elements $A_1$, $B_1$, $C_1$, and $D_1$ by a second set of values that contains elements $I_1$, $J_1$, $K_1$, and $L_1$ to produce the third set of values.

This third set of values is provided to a summing unit 114. The summing unit 114 includes any combination of hard-coded logic, programmable logic, and/or software to receive the third set of values and to sum the values therein. In some examples, the summing unit 114 includes a Hamming weight engine, which counts the number of non-zero values in the third set in order to sum the binary values. The Hamming weight engine may be implemented as a tree of adders 126 or other suitable structure. The summing unit 114 produces a sum that represents the dot product of the sets. Referring to the example of FIG. 1A, the sum represents the dot product of the first set of values containing elements $A_1$, $B_1$, $C_1$, and $D_1$ and the second set of values containing elements $I_1$, $J_1$, $K_1$, and $L_1$.

The summing unit 114 provides the sum to the shifting unit 116, which may shift the sum one or more positions based on the place value of the set of matrix values and/or the place value of the set of vector values. In the example of FIG. 1A, the shifting unit 116 shifts the sum once based on the place value of the first set of values ($2^1$) and once again based on the place value of the second set of values ($2^1$).

The shifting unit 116 may then add the shifted sum to a running total. The running total is updated as each set of the matrix 102 is multiplied by each set of the vector 106. In various examples, the shifting unit 116 includes any suitable combination of hard-coded logic, programmable logic, and/or software to shift the received sum and to maintain the running total.

The processes may be repeated for each set of matrix values in the row and each set of vector values in the vector. For example, referring to FIG. 1B, the memory array 108 provides a set of matrix values containing elements $A_0$, $B_0$, $C_0$, and $D_0$ on the data lines 122. The multiplier 112 receives the set of matrix values and multiplies it by the set of vector values containing elements $I_1$, $J_1$, $K_1$, and $L_1$. The summing unit 114 sums the elements of the resultant set, and the shifting unit 116 shifts the sum once based the place value of the set of vector values ($2^1$) before adding the shifted sum to the running total.

Figure 1C:
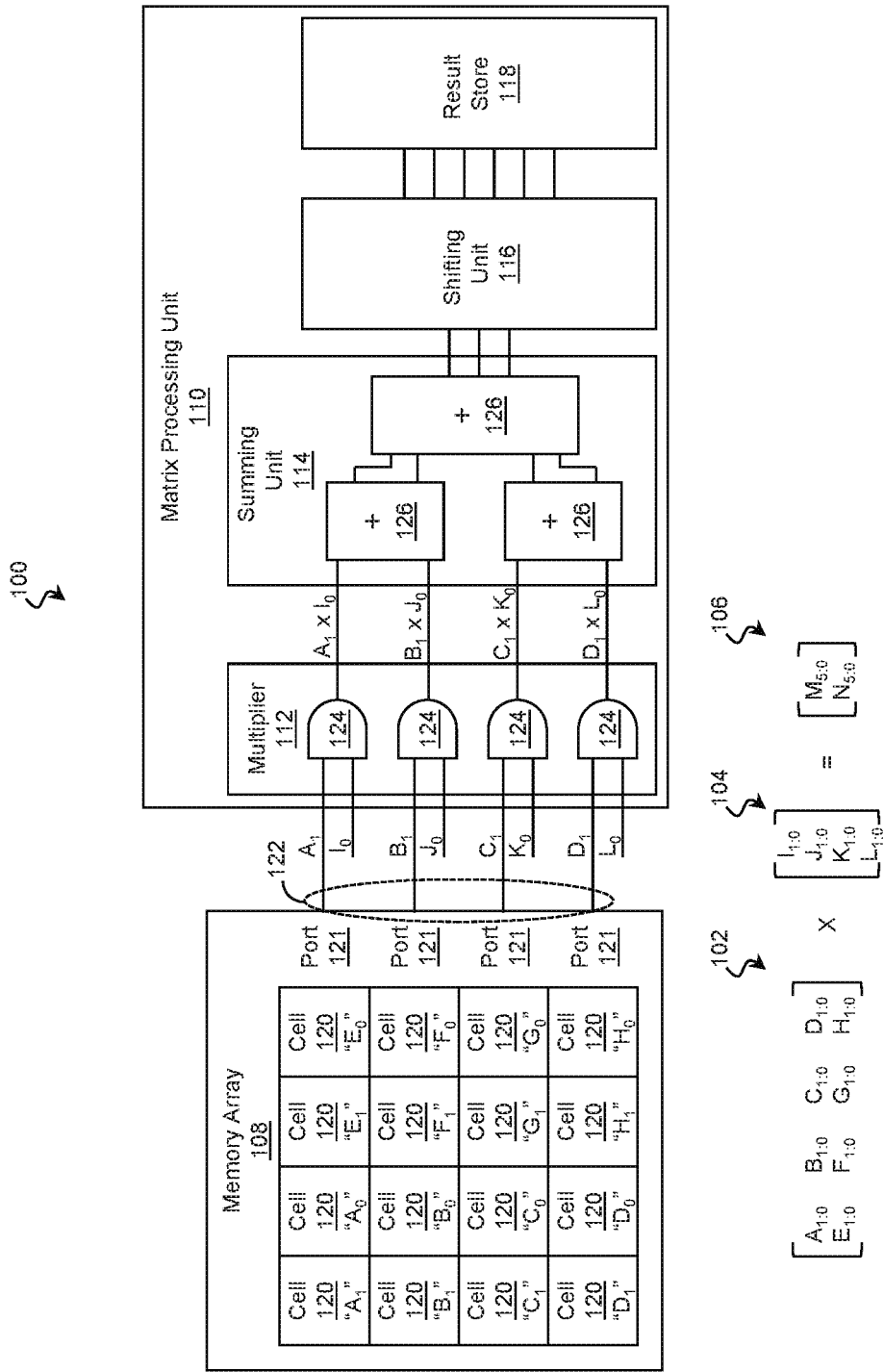

The example continues in FIG. 1C, where the memory array 108 provides the set of matrix values containing elements $A_1$, $B_1$, $C_1$, and $D_1$ on the data lines 122 again. In some examples, the memory array 108 is configured to read and provide the set multiple times between refreshes of the memory cells 120 that contain the set. This may reduce the overhead of maintaining data in the memory array 108.

The multiplier 112 multiplies this set of matrix values by a set of vector values containing elements $I_0$, $J_0$, $K_0$, and $L_0$. The summing unit 114 sums the elements of the resultant set, and the shifting unit 116 shifts the sum once based the place value of the set of matrix values ($2^1$) before adding the shifted sum to the running total.

Figure 1D:
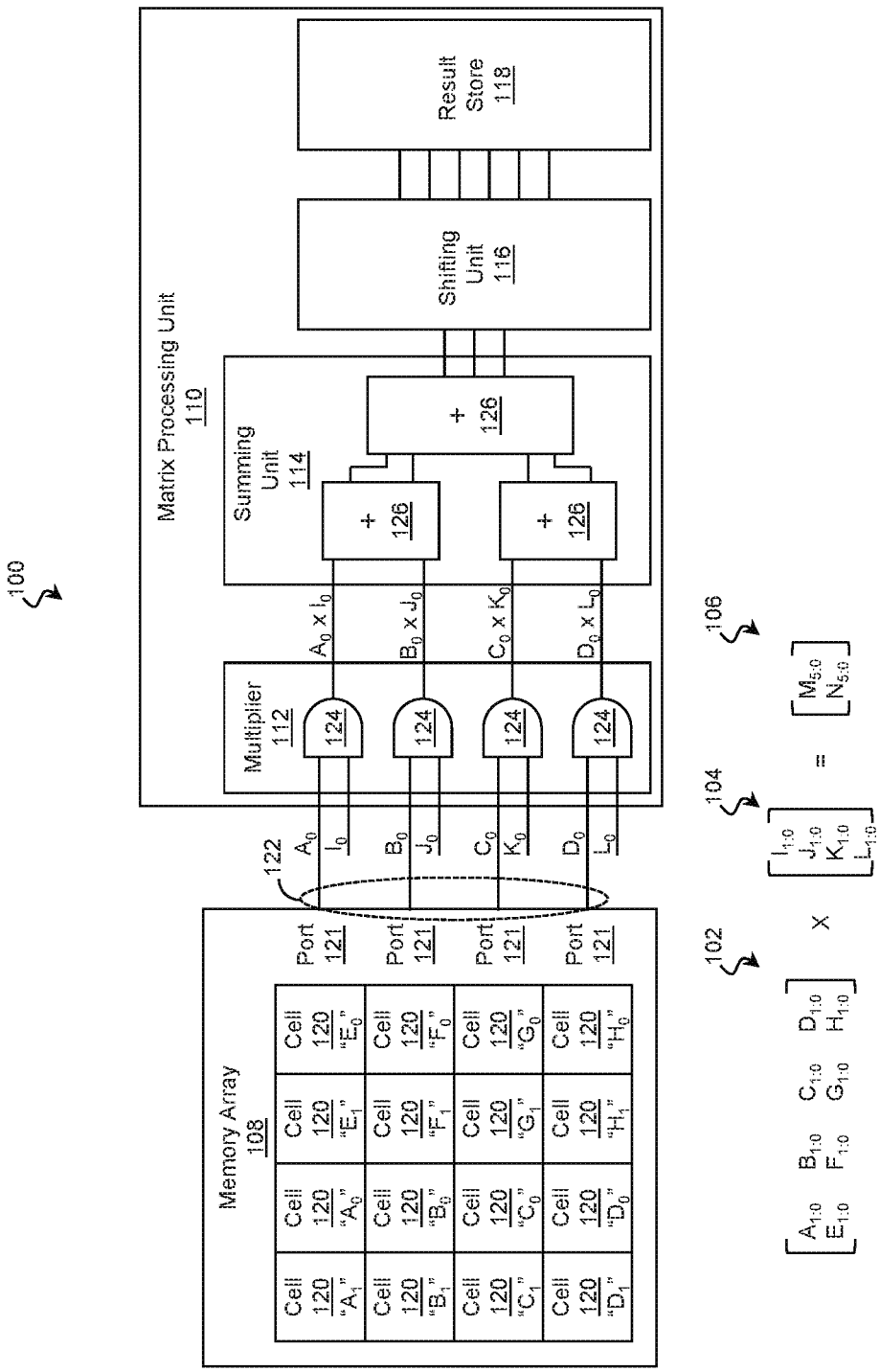

Finally, referring to FIG. 1D, the memory array 108 provides the set of matrix values containing elements $A_0$, $B_0$, $C_0$, and $D_0$ on the data lines 122 again. The multiplier 112 multiplies this set of matrix values by the set of vector values containing elements $I_0$, $J_0$, $K_0$, and $L_0$. The summing unit 114 sums the elements of the resultant set, and the shifting unit 116 adds the unshifted sum to the running total based on the place value of the set of matrix values and the set of vector values. In the example, the running total at this point in time represents an element (e.g., element M) of a vector result of the matrix-vector operation, and the running total is provided to a result store 118 for storing. As with the memory array 108, the result store 118 may include any suitable programmable element for storing the results. After storing the running total in the result store 118, the running total may be reset.

The processes may be repeated for each row in the matrix 102 to determine the remaining element(s) in the result vector 106. Furthermore, in some examples, the input vector is a subset of a second matrix. In such examples, the circuit 100 repeats the processes for each row in the first matrix and each column in the second matrix.

Figure 2:
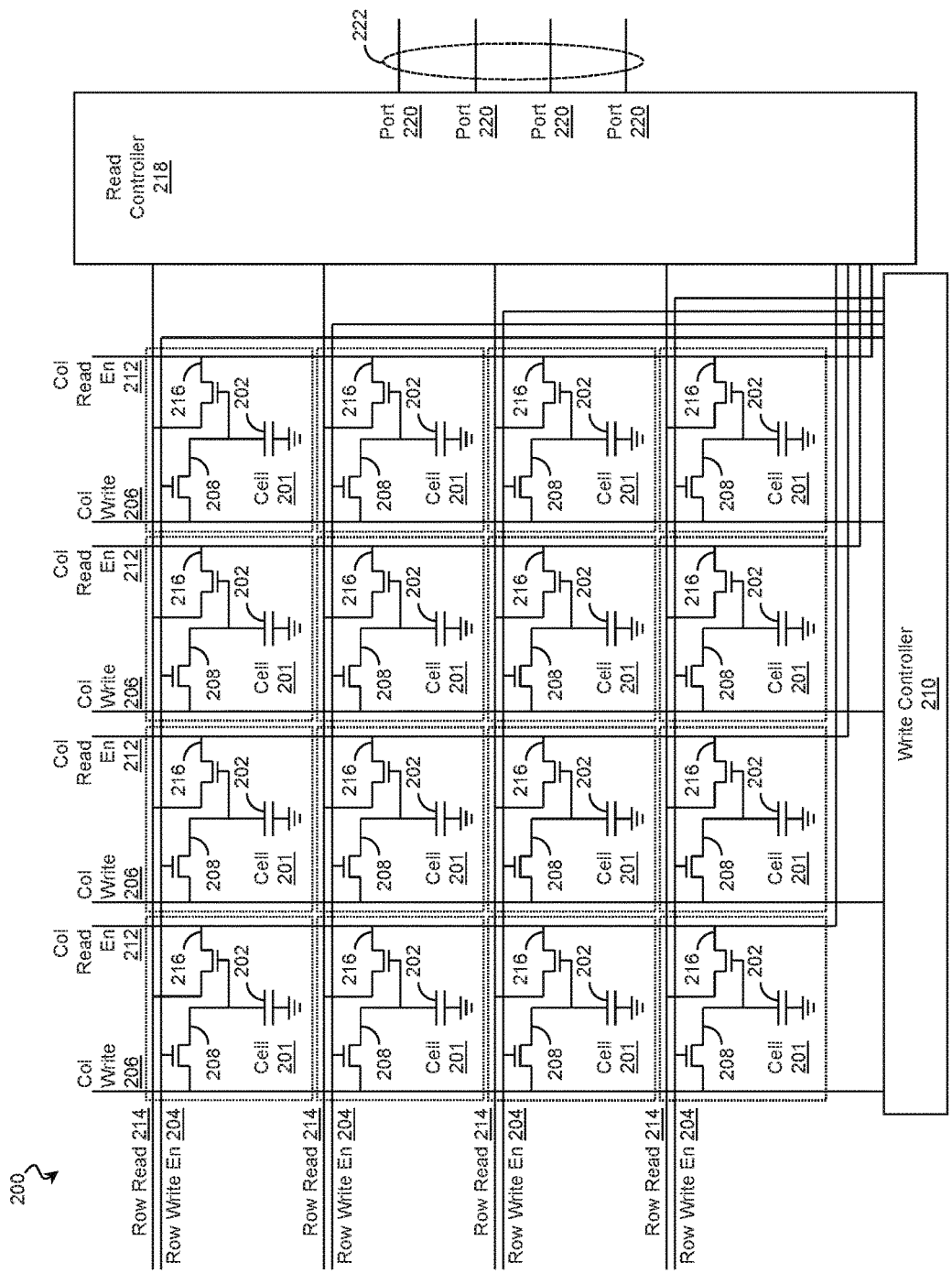
FIG. 2 is a schematic diagram of a memory array according to some examples of the present disclosure.

As described above, the memory cells 120 of the memory array 108 may include any suitable programmable elements, some examples of which are described with reference to FIG. 2. In that regard FIG. 2 is a schematic diagram of a memory array 200 according to some examples of the present disclosure. The memory array 200 is suitable for use as the memory array 108 of FIG. 1 and includes any number of memory cells 201, each of which may be substantially similar to those described above. While the illustrated memory array 200 includes a limited number of memory cells 201, in other examples, the memory array 200 includes any number of memory cells 201.

Each memory cell 201 includes a programmable element such as a capacitor 202. The capacitor 202 may store a charge, and a magnitude or presence of the charge may represent a binary value of a corresponding element of a matrix 102.

To read and write values to the cells 201, each memory cell 201 may be coupled to a plurality of control lines within the memory array 200. For example, the memory array 200 may include a set of row write enable lines 204 and a set of column write lines 206. Each memory cell 201 may include an access transistor 208 with a source and drain coupled between the capacitor 202 and a corresponding column write line 206. The gate of the access transistor 208 is coupled to a corresponding row write enable line 204. A write controller 210 of the memory array 200 may program the memory cells 201 a row at a time by enabling the row write enable line 204 for the row and by applying voltages on the column write lines 206 corresponding to the values to be stored in the memory cells 201.

In some examples, the control lines include a set of column read enable lines 212 and a set of row read lines 214. Each memory cell 201 may include a pass transistor 216 with a source and drain coupled between a corresponding column read enable line 212 and a corresponding row read line 214. The gate of the pass transistor 216 is coupled to the capacitor 202 such that the mode of operation of the pass transistor 216 is determined by the magnitude of the charge stored in the capacitor 202. A read controller 218 of the memory array 200 may read the memory cells 201 a column at a time by providing a voltage on the corresponding column read enable line 212 and detecting voltage and/or current on the set of row read lines 214.

The read controller 218 may amplify, smooth, and/or otherwise shape the signals on the row read lines 214 before providing them at ports 220 of the memory array 200. The ports 220 produce signals on the data lines 222 that represent the values in the corresponding memory cells 201 at voltages and forms suitable for use in driving other circuitry. In some examples, because the capacitor 202 drives the gate of the pass transistor 216, the capacitor 202 charge is not significantly dissipated by the reading process and multiple reads of a memory cell 201 may be performed without refreshing the capacitor 202 charge.

Figure 3:
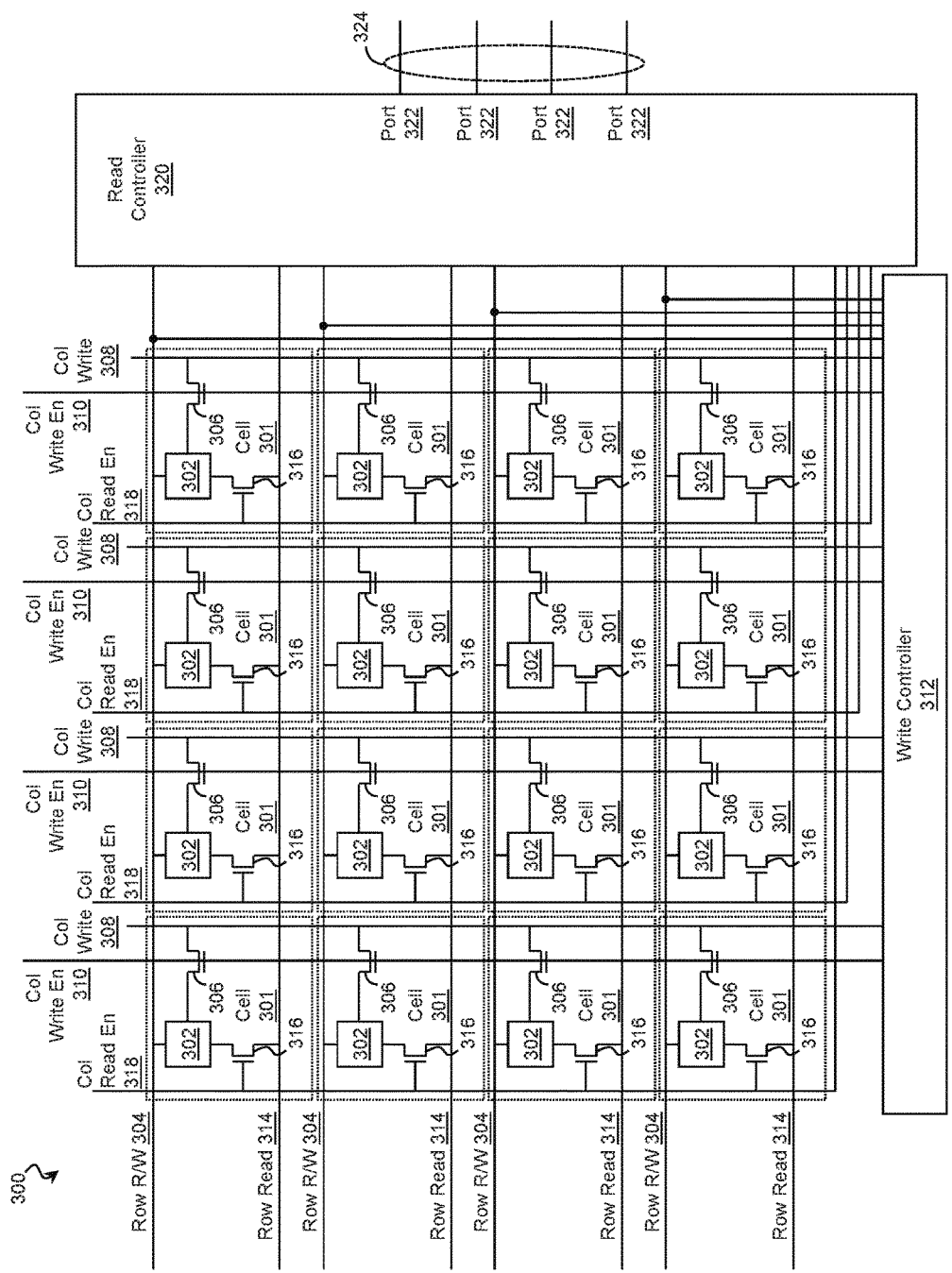
FIG. 3 is a schematic diagram of a resistive memory array according to some examples of the present disclosure.

Further examples of suitable memory arrays 108 of the circuit 100 are described with reference to FIG. 3, which is a schematic diagram of a resistive memory array 300 according to some examples of the present disclosure. The memory array 300 is suitable for use as the memory array 108 of FIG. 1 and includes any number of memory cells 301, each of which may be substantially similar to those described above.

Each memory cell 301 includes a resistive memory device 302, such as a memristor. A resistive memory device 302 may have more than one resistance/conductance state, and the state of the device may be used to store data. In some examples, the conductive state of a resistive memory device represents a binary value of a corresponding element of the matrix 102.

The conductive state of the resistive memory device 302 may be set by applying a voltage that exceeds a write threshold to the resistive memory device 302. Accordingly, the resistive memory device 302 may be coupled to a row read/write line 304 and coupled by an access transistor 306 to a column write line 308. The gate of the access transistor 306 may be coupled to a column write enable line 310. A write controller 312 of the memory array 300 may program the state of the resistive memory devices 302 a row at a time by applying a voltage differential across the row read/write line 304 and each of the column write lines 308 that exceeds the write threshold of the resistive memory devices 302. The write controller 312 selects which cells 301 in the row to write by selectively enabling the column write enable lines 310 to activate the respective access transistors 306.

The state of a resistive memory device 302 may be read by applying a voltage less than the write threshold to the resistive memory device 302 and detecting the current induced by the voltage. As noted above, the resistive memory device 302 may be coupled to the row read/write line 304. The resistive memory device 302 may be coupled to a row read line 314 by a pass transistor 316 with a gate of the pass transistor 316 coupled to a column read enable line 318. In such examples, a read controller 320 of the memory array 300 may read the memory cells 301 a column at a time by enabling the column read enable lines 318, applying a voltage differential across the each of the row read/write lines 304 and each of the row read lines 314, and detecting voltage and/or current on the set of row read/write lines 304 and/or the set of row read lines 314 due to the applied voltage differential. The read controller 320 may amplify, smooth, shape, and/or otherwise translate the detected voltage or current to produce signals at the ports 322 and on the data lines 324 that represent the values in the corresponding memory cells 301 at voltages and forms suitable for use in driving other circuitry.

Figure 4:
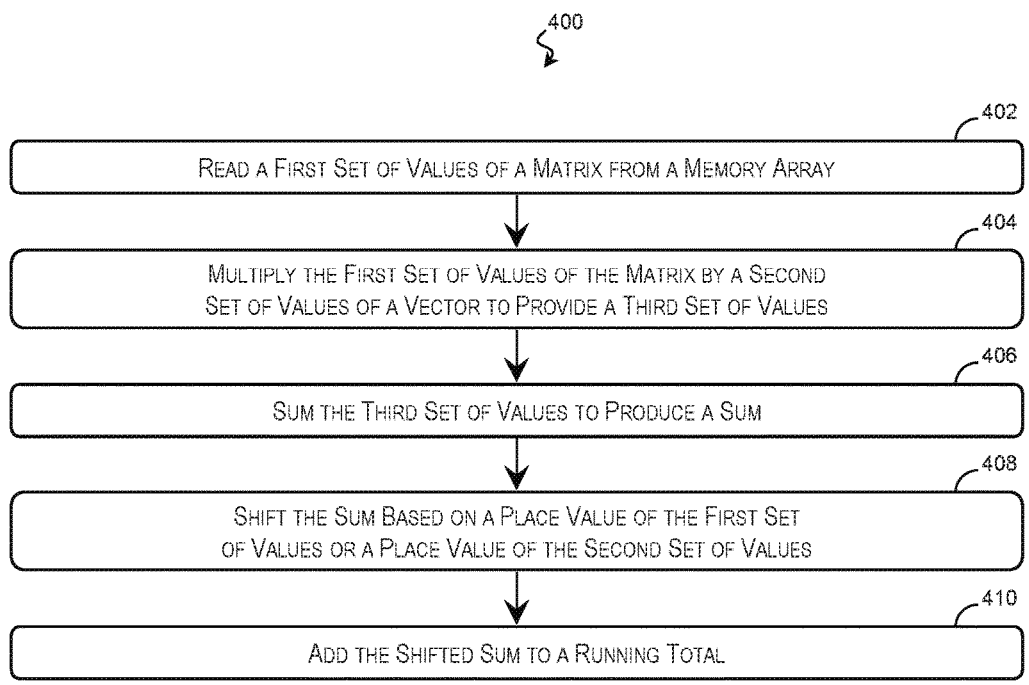
FIG. 4 is a flow diagram of a method of performing a matrix operation according to some examples of the present disclosure.

Examples of performing a matrix operation using the circuit 100 are described with reference to FIG. 4, which is a flow diagram of a method 400 of performing the matrix operation according to some examples of the present disclosure. The description of the method 400 is non-limiting, and steps may be added to and omitted from the method 400 without departing from the disclosure. Furthermore, unless noted otherwise, processes of the method 400 may be performed in any order including being performed concurrently by one or more entities.

Referring to block 402, a first set of values of a matrix are read from a memory array 108. Referring to block 404 of FIG. 4, the first set of values of the matrix are multiplied by a second set of values of a vector to provide a third set of values. Referring to block 406 of FIG. 4, the elements of the third set of values are summed to produce a sum.

Referring to block 408, the sum is shifted based on a place value of the first set of values or a place value of the second set of values, and referring to block 410, the shifted sum is added to a running total.

Figure 5:
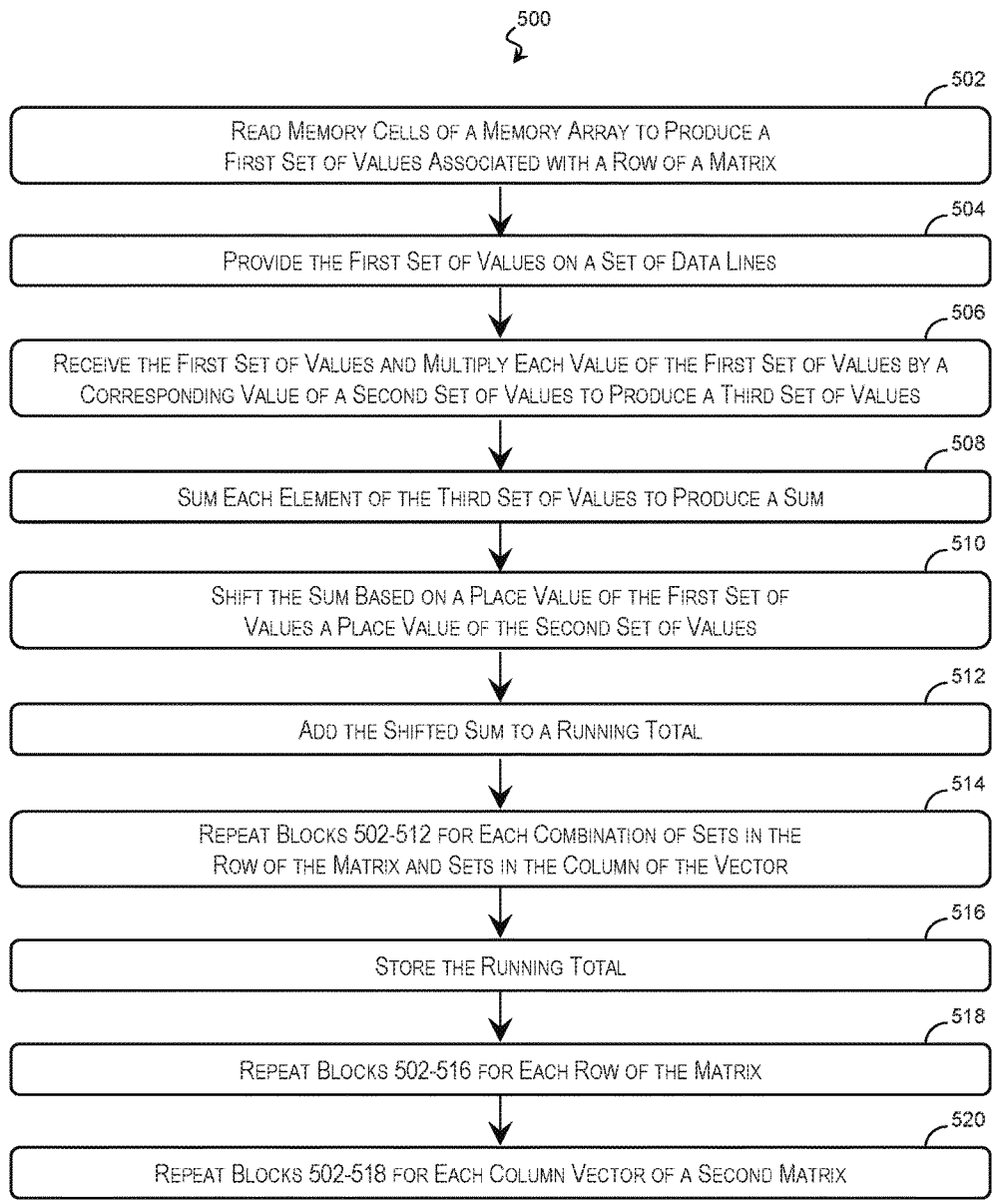
FIG. 5 is a flow diagram of a method of performing a matrix multiplication operation according to some examples of the present disclosure.

Referring now to FIG. 5, illustrated is a flow diagram of a method 500 of performing a matrix multiplication operation according to some examples of the present disclosure. The description of the method 500 is non-limiting, and steps may be added to and omitted from the method 500 without departing from the disclosure. Furthermore, unless noted otherwise, processes of the method 500 may be performed in any order including being performed concurrently by one or more entities. The method 500 is suitable for performing using the circuit 100 of FIGS. 1A-1D, 2, and 3 and/or any other suitable circuit or device.

Referring to block 502, a read controller of a memory array 108 reads a column of the array's memory cells 120 to produce a first set of values associated with a row of a matrix. Each value may be a bit of a respective element in the row of the matrix and each value in the set shares a common place value. Referring to block 504, the read controller provides the first set of values on a set of data lines 122.

Referring to block 506, a multiplier 112 receives the first set of values and multiplies each value of the first set of values by a corresponding value of a second set of values. The second set of values may correspond to a column of a vector such that each value is a bit of a respective element in the column and each value in the second set shares a common place value. In multiplying the first set of values by the second set of values, the multiplier 112 produces a third set of values.

Referring to block 508, a summing unit 114 sums each element of the third set of values to produce a sum. The sum may represent the dot product of the first set of values and the second set of values. Referring to block 510, a shifting unit 116 shifts the sum based on a place value of the first set of values and/or a place value of the second set of values. Referring to block 512, the shifting unit 116 adds the shifted sum to a running total.

Referring to block 514, the processes of blocks 502-512 are repeated for each combination of sets in the row of the matrix and sets in the column of the vector. The number of times that the processes are repeated may depend on the bit-length of the elements in the row of the matrix and the bit-length of the elements in the row of the vector, and the method 500 may be adapted to a matrix and vector of any suitable bit-length by merely adjusting the number of iterations. Thus, the memory array 108 and the matrix processing unit 110 may support a range of suitable bit-lengths without modifications to the underlying hardware. Once the processes have been repeated for each combination, the running total is stored in a result store 118 as shown in block 516. The running total maintained by the shifting unit 116 may be reset after it is stored in the result store 118.

Referring to block 518, the processes of blocks 502-516 are repeated for each row in the matrix. Similar to block 514, the number of times that the processes are repeated may depend on the number of rows in the matrix, and the method 500 may be adapted to a matrix of any suitable size by merely adjusting the number of iterations. Accordingly, the memory array 108 and matrix processing unit 110 may support a range of suitable sizes without modifications to the underlying hardware. At the conclusion of block 518, the result store 118 may contain a result vector that is the result of the original matrix multiplied by the vector.

In some examples, the vector is part of another matrix (a second matrix). In some such examples, referring to block 520, the processes of blocks 502-518 are repeated for each column vector in the second matrix. At the conclusion of block 520, the result store 118 may contain a third matrix that is the result of the original matrix multiplied by the second matrix.

Figure 6:
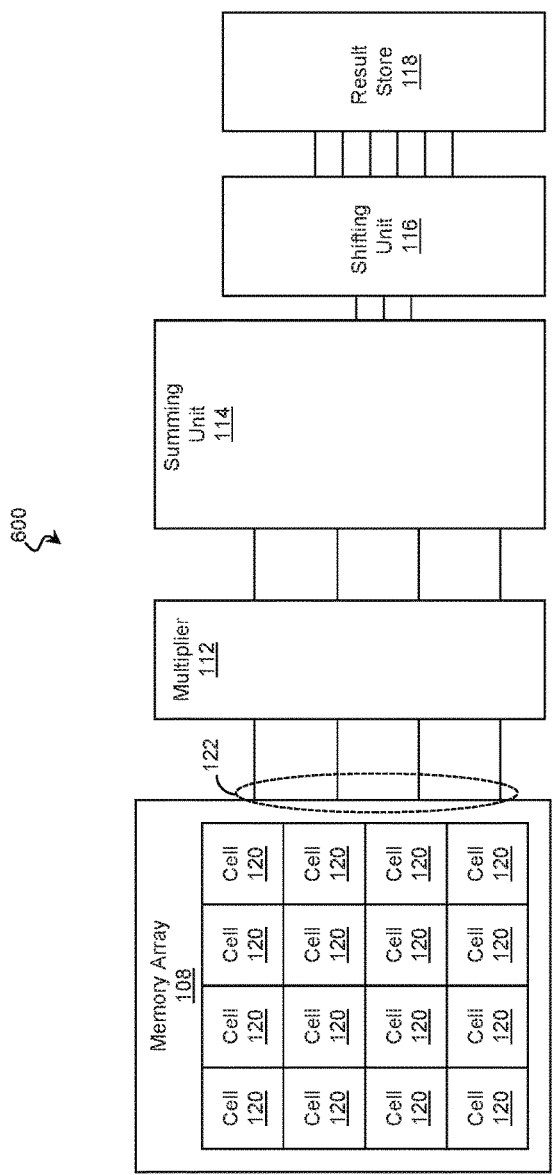
FIG. 6 is a block diagram of a matrix processor circuit according to some examples of the present disclosure.

Further examples of suitable circuits for performing method 400 and/or method 500 are described with reference to FIG. 6, which is a block diagram of a matrix processor circuit 600 according to some examples of the present disclosure. The matrix processor circuit 600 includes a memory array 108, a multiplier 112, a summing unit 114, and a shifting unit 116, each of which may be similar to those described above in many aspects.

For example, the memory array 108 may include a plurality of memory cells 120 to store elements of a matrix. Each memory cell 120 may include any suitable programmable element, such as the capacitive memory cell 120 of FIG. 2 and/or the restive memory cell 120 of FIG. 3. The memory array 108 may include any number of memory cells 120 arranged to store a matrix of any size, and the number of memory cells 120 may exceed the size and number of bits of the matrix. The memory array 108 includes a plurality of data lines 122 coupled to the memory cells 120 to provide values stored in the memory cells 120. This may be performed substantially as described in block 402 of FIG. 4 and/or blocks 502-504 of FIG. 5. In an example, the data lines 122 provide a first set of values of the matrix. The first set of values may correspond to a row of the matrix, and each value in the first set may be a bit of a corresponding element in the row. The values in the first set have a common place value.

The multiplier 112 is coupled to the data lines 122 and thereby receives the values from the memory array 108. The multiplier 112 may include any combination of hardware and/or software to multiply each value of the first set of values by a corresponding value within a second set of values to produce a third set of values. The second set of values may correspond to a column of a vector, and each value in the second set may be a bit of a corresponding element in the column. The values in the second set have a common place value. This may be performed substantially as described in block 404 of FIG. 4 and/or block 506 of FIG. 5.

The summing unit 114 receives the third set of values from the multiplier 112 and includes any combination of hardware and/or software to sum the third set of values to produce a sum. The sum may represent the dot product of the first set of values and the second set of values. This may be performed substantially as described in block 406 of FIG. 4 and/or block 508 of FIG. 5.

The shifting unit 116 receives the sum from the summing unit 114 and includes any combination of hardware and/or software to shift the sum. The shifting unit 116 shifts the sum based on a place value of the first set of values and/or a place value of the second set of values. This may be performed substantially as described in block 408 of FIG. 4 and/or block 510 of FIG. 5. The shifting unit 116 may then add the shifted sum to a running total. This may be performed substantially as described in block 410 of FIG. 4 and/or block 512 of FIG. 5.

The matrix processor circuit 600 may repeat these processes for each set in the row of the matrix and each set in the column of the vector as described in block 514 of FIG. 5. When each set in the row of the matrix and each set in the column of the vector have been multiplied, the running total may be stored in a result store 118 as described in block 516 of FIG. 5. Furthermore, the matrix processor circuit 600 may repeat these processes for each row in the matrix as described in block 518 of FIG. 5. In some examples, the vector is part of a second matrix. In some such examples, the matrix processor circuit 600 repeats these processes for each column in the second matrix as described in block 520 of FIG. 5.

Figure 7:
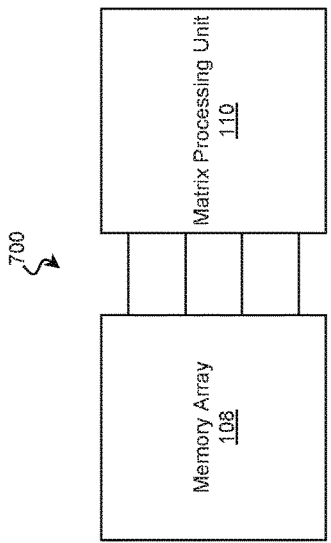
FIG. 7 is a block diagram of a processing circuit according to some examples of the present disclosure.

Referring now to FIG. 7, illustrated is a block diagram of a processing circuit 700 according to some examples of the present disclosure. The processing circuit 700 includes a memory array 108 coupled to a matrix processing unit 110, each of which may be similar to those described above in many aspects.

With respect to the memory array 108, the array 108 may store a matrix of multi-bit values. The matrix may be subdivided into a plurality of matrix sets, where each set corresponds to a row of the matrix and includes a value for each element in the row. The values in each set may share a common place value. Sets of values may be read from the memory array 108 substantially as described in block 402 of FIG. 4 and/or block 502 of FIG. 5.

With respect to the matrix processing unit 110, the unit 110 may include logic to receive each set from the memory array 108 and to multiply each matrix set by a vector set to produce a product. The values of the vector set may correspond to a column of a vector, and each value in the vector set may represent a portion of a corresponding element in the column. The values in each vector set may have a common place value. This may be performed substantially as described in block 404 of FIG. 4 and/or block 506 of FIG. 5.

In some examples, the matrix processing unit 110 includes logic to sum each element of the product of a matrix set and a vector set to produce a total. The total may represent a dot product of the matrix and vector sets. This may be performed substantially as described in block 406 of FIG. 4 and/or block 508 of FIG. 5.

The matrix processing unit 110 may include logic to shift the total. The amount that the total is shifted may be based on a place value of the matrix set and/or the vector set. This may be performed substantially as described in block 408 of FIG. 4 and/or block 510 of FIG. 5. In some examples, the matrix processing unit 110 includes logic to add the shifted total to a running total. This may be performed substantially as described in block 410 of FIG. 4 and/or block 512 of FIG. 5.

The matrix processing unit 110 may repeat these processes for each matrix set of the row of the matrix and each vector set in the vector as described in block 514 of FIG. 5. Similarly, the matrix processing unit may repeat these processes for each row in the matrix as described in block 518 of FIG. 5. In some examples, the vector is part of a second matrix. In some such examples, the matrix processing unit 110 repeats these processes for each column in the second matrix as described in block 520 of FIG. 5.

Figure 8:
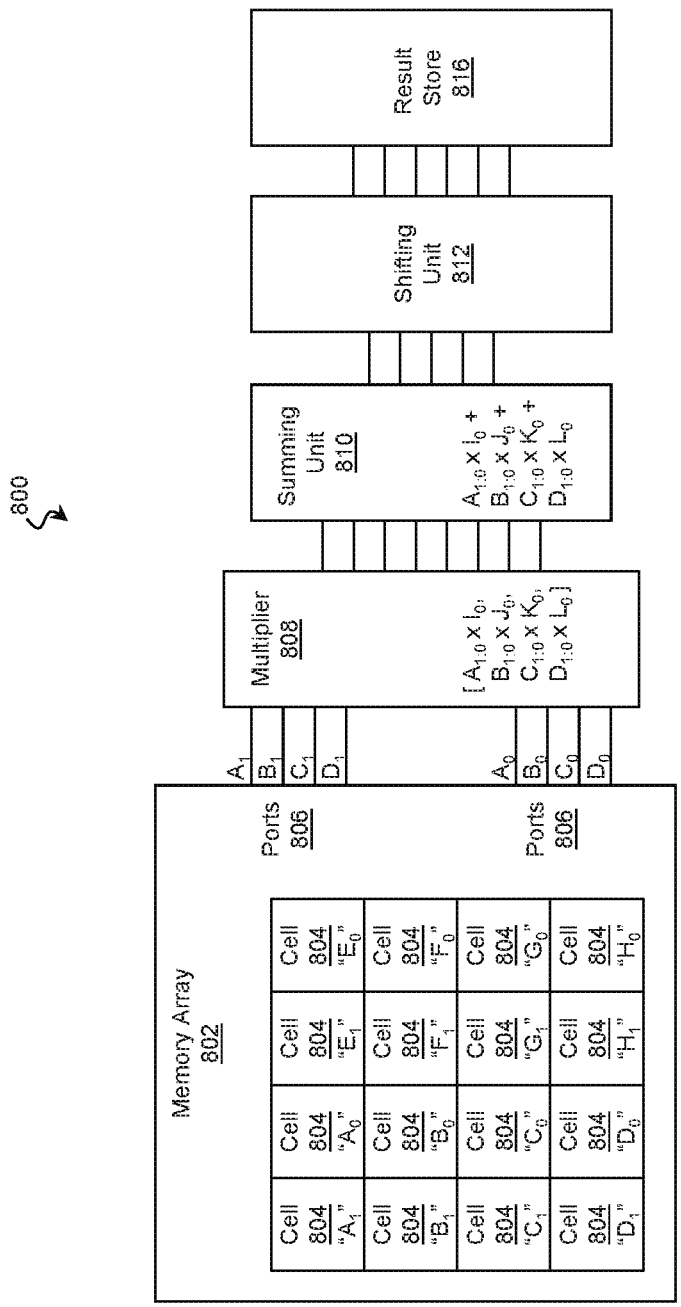
FIG. 8 is a block diagram of a matrix processor circuit according to some examples of the present disclosure.

In further examples, the circuit is structured to read more than one column from the memory array concurrently and to process the values in a multi-bit value. FIG. 8 is a block diagram of a matrix processor circuit 800 according to some examples of the present disclosure. The circuit 800 is suitable for performing method 400 and/or method 500.

The matrix processor circuit 800 includes a memory array 802, which may be substantially similar to those described above in many aspects. The memory array 802 includes any number of memory cells 804, each with a programmable element to store an element of a matrix. In FIG. 8, the cells 804 have been annotated to show storing a matrix that includes elements A-H, each of which has two bits indicated by subscripts, although suitable matrices may be of any size and have any bit-length.

The memory array 802 has a plurality of sets of ports 806, where each set of ports 806 is configured to produce values stored within a respective column of the memory cells 804. Having a plurality of sets of ports 806 may allow multiple columns of memory cells 804 to be read from the memory array 802 concurrently. As a column of memory cells 804 may be used to store a row of a matrix, each set of ports 806 may provide a set of values that correspond to a row of the matrix, with each value in the set being a bit of a corresponding element in the row. This may be performed substantially as described in block 402 of FIG. 4 and/or blocks 502-504 of FIG. 5.

The sets of ports 806 are coupled to respective multiplier 808, which may be substantially similar to the multiplier 112 described above. The multiplier 808 may include any combination of hardware and/or software to multiply each value provided by the ports by a corresponding value within a set of vector values that correspond to a column of a vector. In an example, the multiplier 808 first multiplies the values $[A_{1:0}, B_{1:0}, C_{1:0}, D_{1:0}]$ by the vector $[I_0, J_0, K_0, \text{and } L_0]$. Subsequently the multiplier 808 may multiply the values $[A_{1:0}, B_{1:0}, C_{1:0}, D_{1:0}]$ by other bits of the vector (e.g., $[I_1, J_1, K_1, \text{and } L_1]$). The multiplier combines the respective values from the sets of ports 806 to form multibit values (e.g., $A_{1:0}, B_{1:0}, C_{1:0}, D_{1:0}$, etc.) and multiplies the multibit values by the vector. This may be performed substantially as described in block 404 of FIG. 4 and/or block 506 of FIG. 5.

The multiplier 808 may provide the multiplication results to a summing unit 810, which may be substantially similar to the summing unit 114 described above. The summing unit 810 includes any combination of hardware and/or software to sum the values provided by the multiplier 808. The sum may represent the dot product of the values received by the multiplier 808. This may be performed substantially as described in block 406 of FIG. 4 and/or block 508 of FIG. 5.

A shifting unit 812 receives the results of the summing units 810. The shifting unit 812 includes any combination of hardware and/or software to shift the received sum based on a place value of the matrix values received from the ports 806 of the memory array 802 and/or a place value of the set of vector values. This may be performed substantially as described in block 408 of FIG. 4 and/or block 510 of FIG. 5.

A totaling unit 814 receives the shifted sums from each of the shifting units 812 and adds the shifted sums to a running total. This may be performed substantially as described in block 410 of FIG. 4 and/or block 512 of FIG. 5.

The matrix processor circuit 800 may repeat these processes for each set in the row of the matrix and each set in the column of the vector as described in block 514 of FIG. 5. When each set in the row of the matrix and each set in the column of the vector have been multiplied, the running total may be stored in a result store 118 as described in block 516 of FIG. 5. Furthermore, the matrix processor circuit 800 may repeat these processes for each row in the matrix as described in block 518 of FIG. 5.

In some examples, the vector is part of a second matrix. In some such examples, the matrix processor circuit 800 repeats these processes for each column in the second matrix as described in block 520 of FIG. 5.

The increased read ports 806 and the multi-bit multiplier 808 and summing unit 810 allow multiple columns of the memory array 802 to be read and processed in parallel. In this way, the circuit 800 may increase the computational throughput with a nominal increase in circuit area.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:
1. A circuit comprising:
   a memory array including:
      a plurality of memory cells to store a matrix; and
      a plurality of data lines coupled to the plurality of memory cells to provide a first set of values of the matrix;
   a multiplier coupled to the plurality of data lines to multiply the first set of values by a second set of values to produce a third set of values;
   a summing unit coupled to the multiplier to sum the third set of values to produce a sum; and
   a shifting unit coupled to the summing unit to shift the sum and to add the shifted sum to a running total.
2. The circuit of claim 1, wherein each of the plurality of memory cells includes:
   a capacitor;

an access transistor coupled to the capacitor to program the capacitor; and a pass transistor having a gate coupled to the capacitor to read a value of the matrix that is stored in the capacitor, wherein the value is provided to a corresponding data line of the plurality of data lines.

3. The circuit of claim 2, wherein the access transistor of each of the plurality of memory cells is coupled between the capacitor and a column write line to program the memory array a row at a time.

4. The circuit of claim 3, wherein the pass transistor of each of the plurality of memory cells is coupled to a row read line to read the memory array a column at a time.

5. The circuit of claim 1, wherein each of the plurality of memory cells includes:
a resistive memory device;
an access transistor coupled to the resistive memory device to program the resistive memory device; and
a pass transistor coupled to the resistive memory device to read a value of the matrix that is encoded in the resistive memory device, wherein the value is provided to a corresponding data line of the plurality of data lines.

6. The circuit of claim 1, wherein the memory array, the multiplier, the summing unit, and the shifting unit are to multiply the matrix by a vector that includes the second set of values.

7. The circuit of claim 1, wherein the matrix includes a plurality of multi-bit values, and wherein the first set of values of the matrix have a common place value.

8. The circuit of claim 1, wherein the shifting unit is to shift the sum based on a place value of the first set of values or a place value of the second set of values.

9. A circuit comprising:
a memory array to store a matrix that includes a plurality of multi-bit values, wherein the plurality of multi-bit values includes a plurality of matrix sets, and wherein each set of the plurality of matrix sets contains values having a common place value; and
a matrix processing unit coupled to the memory array and including logic to, for each set of the plurality of matrix sets:
receive the respective set;
multiply the respective set by a vector set;
sum each element of the product of the respective set and the vector set to produce a total;
shift the total; and
add the shifted total to a running total.

10. The circuit of claim 9, wherein the memory array stores the matrix in a plurality of memory cells, and wherein each memory cell includes:

a capacitor;
an access transistor coupled to the capacitor to program the capacitor; and
a pass transistor having a gate coupled to the capacitor to read a value of the matrix that is stored in the capacitor.

11. The circuit of claim 10, wherein the access transistor of each of the plurality of memory cells is coupled between the capacitor and a column line to program the memory array a row at a time.

12. The circuit of claim 11, wherein the pass transistor of each of the plurality of memory cells is coupled to a row line to read the memory array a column at a time.

13. The circuit of claim 9, wherein the memory array stores the matrix in a plurality of memory cells, and wherein each of the plurality of memory cells includes:
a resistive memory device;
an access transistor coupled to the resistive memory device to program the resistive memory device; and
a pass transistor coupled to the resistive memory device to read a value of the matrix that is encoded in the resistive memory device.

14. The circuit of claim 9, wherein the vector multiplication unit is to shift the total based on a place value of the respective set of the plurality of matrix sets or a place value of the vector set.

15. A method comprising:
reading a first set of values of a matrix from a memory array;
multiplying the first set of values of the matrix by a second set of values of a vector to provide a third set of values;
summing the third set of values to produce a sum;
shifting the sum based on a place value of the first set of values or a place value of the second set of values; and
adding the shifted sum to a running total.

16. The method of claim 15 comprising writing the matrix to the memory array a row at a time.

17. The method of claim 16, wherein the reading of the first set of values reads from the memory array a column at a time.

18. The method of claim 15, wherein the matrix includes a plurality of multi-bit values, and wherein the first set of values of the matrix have a common place value.

19. The method of claim 15, wherein the memory array includes a plurality of capacitors that store the matrix, and wherein the reading of the first set of values retains the first set of values within the plurality of capacitors.

20. The method of claim 15, wherein the memory array includes a plurality of resistive memory devices that store the matrix.

* * * * *